US012604751B2

(12) United States Patent (10) Patent No.: US 12,604,751 B2
Song et al. (45) Date of Patent: Apr. 14, 2026

(54) SEMICONDUCTOR PACKAGE

(71) Applicant: Samsung Electronics Co., Ltd.,
Suwon-si (KR)

(72) Inventors: Hyeonjun Song, Hwaseong-si (KR);
Taehyeong Kim, Suwon-si (KR);
Sangyoung Kim, Cheonan-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 675 days.

(21) Appl. No.: 17/851,129

(22) Filed: Jun. 28, 2022

(65) Prior Publication Data

US 2023/0005835 A1 Jan. 5, 2023

(30) Foreign Application Priority Data

Jul. 5, 2021 (KR) ........................ 10-2021-0087851

(51) Int. Cl.
H01L 23/498 (2006.01)
H01L 23/00 (2006.01)
(Continued)

(52) U.S. Cl.
CPC ...... H01L 23/49894 (2013.01); H01L 23/291
(2013.01); H01L 23/293 (2013.01); H01L
23/3171 (2013.01); H01L 23/3192 (2013.01);
H01L 24/16 (2013.01); H01L 24/32 (2013.01);
H01L 24/73 (2013.01);
(Continued)

(58) Field of Classification Search
CPC ............. H01L 23/49894; H01L 23/291; H01L 23/293; H01L 23/3171; H01L 23/3192;
H01L 24/16; H01L 24/32; H01L 25/0657;
H01L 21/563; H01L 23/3142
See application file for complete search history.

(56) References Cited

U.S. PATENT DOCUMENTS 5,274,913 A 1/1994 Grebe et al.
5,646,439 A 7/1997 Kitayama et al.
(Continued)

FOREIGN PATENT DOCUMENTS

JP 2006-253315 A 9/2006
JP 2007-048860 A 2/2007
(Continued)

OTHER PUBLICATIONS

Office Action for Korean Application No. 10-2021-0087851 dated
May 20, 2025.

*Primary Examiner* — Marlon T Fletcher
*Assistant Examiner* — Da Wei Lee
(74) *Attorney, Agent, or Firm* — Harness, Dickey &
Pierce, P.L.C.

(57) ABSTRACT
A semiconductor package includes a base chip including a
passivation layer on an upper surface thereof, a semicon-
ductor chip on the base chip, a bump on a lower surface of
the semiconductor chip, an underfill layer covering the
bump and covering the lower surface of the semiconductor
chip, an encapsulant covering the semiconductor chip on the
base chip, and an organic material layer on the passivation
layer, wherein the base chip includes silicon (Si), the pas-
sivation layer has a first region in contact with the underfill
layer and a second region, surrounding the first region, and
the organic material layer is on the second region.

20 Claims, 6 Drawing Sheets

(51) Int. Cl.

| | |
|---|---|
| *H01L 23/29* | (2006.01) |
| *H01L 23/31* | (2006.01) |
| *H01L 25/065* | (2023.01) |

(52) U.S. Cl.

CPC ...... *H01L 25/0652* (2013.01); *H01L 25/0657* (2013.01); *H01L 23/49816* (2013.01); *H01L 23/49822* (2013.01); *H01L 23/49833* (2013.01); *H01L 2224/16148* (2013.01); *H01L 2224/16227* (2013.01); *H01L 2224/16238* (2013.01); *H01L 2224/32059* (2013.01); *H01L 2224/32145* (2013.01); *H01L 2224/32225* (2013.01); *H01L 2224/73204* (2013.01); *H01L 2224/73253* (2013.01); *H01L 2225/06513* (2013.01); *H01L 2225/06524* (2013.01); *H01L 2225/06527* (2013.01); *H01L 2225/06541* (2013.01); *H01L 2225/06589* (2013.01); *H01L 2924/1431* (2013.01); *H01L 2924/1436* (2013.01); *H01L 2924/182* (2013.01); *H01L 2924/186* (2013.01); *H01L 2924/3511* (2013.01); *H01L 2924/35121* (2013.01); *H01L 2924/37001* (2013.01)

(56) References Cited

U.S. PATENT DOCUMENTS

| | | | |
|---|---|---|---|
| 2009/0155984 | A1 | 6/2009 | Kim et al. |
| 2010/0230811 | A1* | 9/2010 | Shin .......................... H01L 24/05 |
| | | | 257/737 |
| 2011/0272820 | A1 | 11/2011 | Lee et al. |
| 2012/0181686 | A1 | 7/2012 | Park et al. |
| 2020/0051957 | A1 | 2/2020 | Sano |
| 2021/0020555 | A1* | 1/2021 | Herard .................... H01L 24/83 |
| 2021/0057225 | A1 | 2/2021 | Sandoh et al. |
| 2022/0013501 | A1* | 1/2022 | Kim ......................... H01L 24/05 |
| 2023/0130983 | A1* | 4/2023 | Lee ..................... H01L 25/0652 |
| | | | 257/787 |
| 2023/0275036 | A1* | 8/2023 | Lee ....................... H01L 23/562 |
| | | | 257/687 |

FOREIGN PATENT DOCUMENTS

| | | | |
|---|---|---|---|
| JP | 2010-182890 | A | 8/2010 |
| JP | 2013-135061 | A | 7/2013 |
| KR | 10-2009-0061996 | A | 6/2009 |
| KR | 20100103214 | A | 9/2010 |
| KR | 10-2011-0123038 | A | 11/2011 |
| KR | 10-2012-0084194 | A | 7/2012 |
| KR | 20190091752 | A | 8/2019 |
| KR | 20200069064 | A | 6/2020 |
| KR | 20210065353 | A | 6/2021 |

* cited by examiner

1000A

1000A

I-I'

SEMICONDUCTOR PACKAGE

CROSS-REFERENCE TO RELATED APPLICATION(S)

This application claims benefit of priority to Korean Patent Application No. 10-2021-0087851 filed on Jul. 5, 2021 in the Korean Intellectual Property Office, the disclosure of which is incorporated herein by reference in its entirety.

BACKGROUND

The present inventive concepts relate to a semiconductor packages.

According to weight reductions and the implementation of high performance in electronic devices, miniaturization and high performance are desired in the semiconductor package field as well. In order to realize miniaturization, weight reduction, high performance, high capacity, and high reliability of semiconductor packages, research and development of a semiconductor package having a structure in which semiconductor chips are stacked in multiple stages have been continuously conducted.

SUMMARY

An aspect of the present inventive concepts is to provide semiconductor packages having improved reliability and production yield.

According to an aspect of the present inventive concepts, a semiconductor package includes: a base chip including a passivation layer on an upper surface thereof; a semiconductor chip on the base chip; a bump on a lower surface of the semiconductor chip; an underfill layer covering the bump and covering the lower surface of the semiconductor chip; an encapsulant covering the semiconductor chip on the base chip; and an organic material layer on the passivation layer, wherein the base chip includes silicon (Si), the passivation layer has a first region in contact with the underfill layer and a second region, surrounding the first region, and the organic material layer is on the second region.

According to an aspect of the present inventive concepts, a semiconductor package includes: a first semiconductor chip having a first region and a second region, surrounding the first region; a semiconductor structure including a second semiconductor chip on the first region of the first semiconductor chip; an underfill layer covering a region in which the first semiconductor chip and the semiconductor structure overlap each other in the first region and covering at least portion of a lower end of a side surface of the semiconductor structure; a first organic material layer surrounding a side surface of the underfill layer on the second region; and an encapsulant covering the semiconductor structure on the first semiconductor chip, wherein the first semiconductor chip has an area larger than that of the second semiconductor chip in plan view.

According to an aspect of the present inventive concepts, a semiconductor package includes: a package substrate; an interposer substrate on the package substrate and including a silicon (Si) layer; a first semiconductor structure on the interposer substrate; a second semiconductor structure adjacent to the first semiconductor structure on the interposer substrate; and an encapsulant covering the first semiconductor structure and the second semiconductor structure on the interposer substrate, wherein an upper surface of the interposer substrate has a first region in which the first semiconductor structure and the second semiconductor structure are mounted and a remaining second region, and the interposer substrate may further include an organic material layer on the second region and including a photosensitive polyimide (PSPI).

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1A:
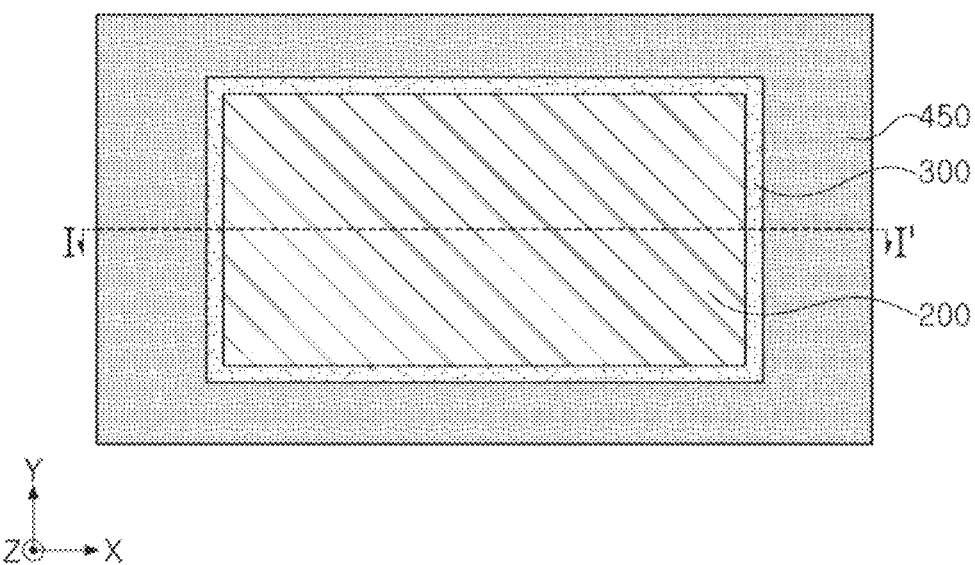
FIG. 1A is a plan view illustrating a semiconductor package according to some example embodiments of the present inventive concepts.
Figure 1B:
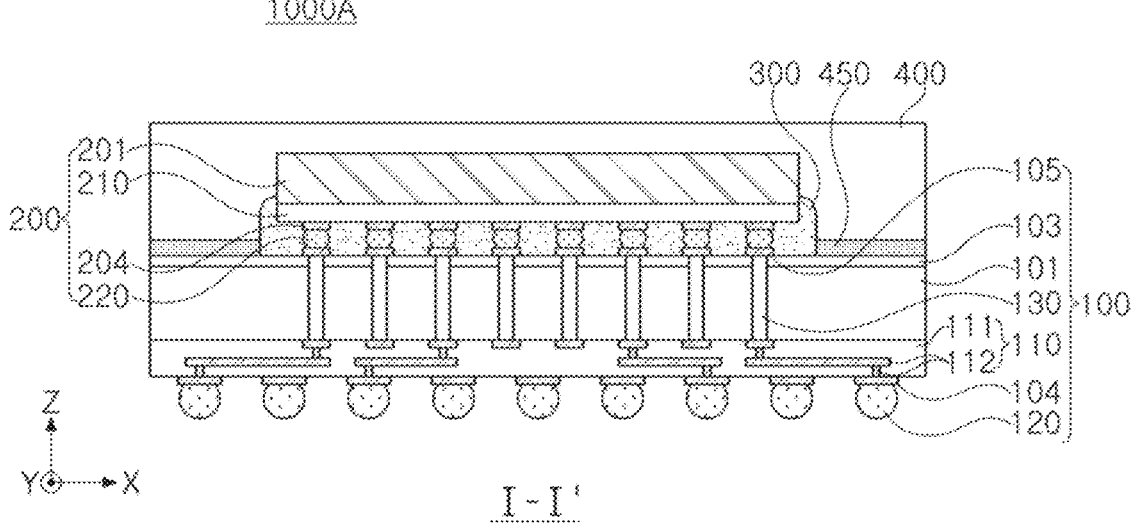
FIG. 1B is a cross-sectional view taken along line I-I' of FIG. 1A.

FIG. 1A is a schematic plan view illustrating a semiconductor package 1000A according to some example embodiments of the present inventive concepts, and FIG. 1B is a cross-sectional view taken along line I-I' in FIG. 1A.

Referring to FIGS. 1A and 1B, the semiconductor package 1000A according to some example embodiments may include a base chip 100, a semiconductor chip 200, an underfill layer 300, an encapsulant 400, and an organic material layer 450 disposed on the base chip 100. FIG. 1A is a plan view illustrating the semiconductor package 1000A according to some example embodiments except for some components, for example, the encapsulant 400.

The base chip 100 may include a semiconductor material such as a silicon (Si) wafer. In some example embodiments, the base chip 100 may include a first substrate 101, a passivation layer 103, an upper pad 105, a lower pad 104, and a through-silicon via (TSV) 130. In the semiconductor package 1000A, the base chip 100 may further include a first device layer 110 and an external connection terminal 120.

The base chip 100 may be, for example, a buffer chip including a plurality of logic devices and/or memory devices disposed in the first device layer 110. Accordingly, the base chip 100 may transmit a signal from the semiconductor chip 200 stacked thereon externally through the external connection terminal 120 and also transmit a signal and power from the outside to the semiconductor chip 200. The base chip 100 may perform both a logic function and a memory function through logic elements and the memory elements, or according to some example embodiments, the base chip 100 may include only logic elements and perform the logic function. In some example embodiments, the base chip 100 may be an interposer allowing a plurality of semiconductor structures to be mounted thereon.

The first substrate 101 may include, for example, a semiconductor element such as silicon (Si), germanium (Ge), a combination thereof, or the like or may include a compound semiconductor such as silicon carbide (SiC), gallium arsenide (GaAs), indium arsenide (InAs), indium phosphide (InP), a combination thereof, or the like. In some example embodiments, the first substrate 101 may have a silicon on insulator (SOI) structure. The first substrate 101 may include a conductive region, for example, a well doped with an impurity or a structure doped with an impurity. The first substrate 101 may include various device isolation structures such as a shallow trench isolation (STI) structure.

The passivation layer 103 may be formed on an upper surface of the first substrate 101 and protect the first substrate 101. The passivation layer 103 may be formed of an insulating layer such as a silicon oxide film, a silicon nitride film, and/or a silicon oxynitride film, but a material of the passivation layer 103 is not limited thereto. In some example embodiments, a separate passivation layer may be further formed on a lower surface of the first device layer 110.

The upper pad 105 may be disposed on the passivation layer 103. The upper pad 105 may include, for example, at least one of aluminum (Al), copper (Cu), nickel (Ni), tungsten (W), platinum (Pt), or gold (Au). The lower pad 104 may be disposed below the first device layer 110 and may include the same material as that of the upper pad 105. In some example embodiments, the first device layer 110 may be omitted, and in this case, the lower pad 104 may be disposed on a lower surface of the first substrate 101. However, the materials of the upper pad 105 and the lower pad 104 are not limited to the above materials. The upper pad 105 and the lower pad 104 may be electrically connected to each other.

The TSV 130 may penetrate through the first substrate 101 in a vertical direction (a Z-direction) and may provide an electrical path connecting the upper pad 105 and the lower pad 104. One side of the TSV 130 may penetrate through the passivation layer 103 to contact the upper pad 105. An opposite side of the one side of the TSV 130 may contact the lower pad 104. The TSV 130 may include a conductive plug and a barrier film surrounding the conductive plug. The conductive plug may include a metal material, for example, tungsten (W), titanium (Ti), aluminum (Al), and/or copper (Cu). The conductive plug may be formed by a plating process, a PVD process, or a CVD process. The barrier film may include an insulating barrier film and/or a conductive barrier film. The insulating barrier film may be formed of an oxide film, a nitride film, a carbide film, a polymer, or a combination thereof. In some example embodiments, the conductive barrier film may be disposed between the insulating barrier film and the conductive plug. The conductive barrier film may include, for example, a metal compound such as tungsten nitride (WN), titanium nitride (TiN), or tantalum nitride (TaN). The barrier film may be formed by a PVD process or a CVD process.

The first device layer 110 may be disposed on the lower surface of the first substrate 101 and may include various types of devices. For example, the first device layer 110 may include a field effect transistor (FET) such as a planar FET or a FinFET, a memory device such as flash memory, dynamic random access memory (DRAM), static random access memory (SRAM), electrically erasable programmable read-only memory (EEPROM), phase-change random access memory (PRAM), magnetoresistive random access memory (MRAM), ferroelectric random access memory (FeRAM), resistive random access memory (RRAM), logic elements such as AND, OR NOT, various active devices and/or passive devices such as system large scale integration (LSI), CMOS imaging sensor (CIS), micro-electro-mechanical system (MEMS), etc.

A lower surface of the base chip 100 on which the first device layer 110 is disposed may be referred to as an active surface of the base chip 100, and the opposite side of the active surface may be referred to as an inactive surface of the base chip 100.

The first device layer 110 may include an interlayer insulating layer 111 covering the devices and a multilayer wiring layer 112 electrically connected to the devices. The interlayer insulating layer 111 may include silicon oxide or silicon nitride. The multilayer wiring layer 112 may include multilayer wirings and/or vertical contacts. The multilayer wiring layer 112 may connect the devices of the first device layer 110 to each other, connect the devices to the conductive region of the first substrate 101, or connect the devices to the external connection terminal 120.

The external connection terminal 120 may be disposed on the lower pad 104 and may be connected to the multilayer wiring layer 112 inside the first device layer 110 or the TSV 130. The external connection terminal 120 may be formed of a solder ball. However, according to some example embodiments, the external connection terminal 120 may have a structure including a pillar and a solder. The semiconductor package 1000A may be mounted on an external substrate such as a main board through the external connection terminal 120.

The semiconductor chip 200 may be stacked on the base chip 100 and may include a second substrate 201, a second device layer 210, and a bump 220. Although one semiconductor chip 200 is illustrated as being mounted on the base chip 100 in the drawings, the number of semiconductor chips 200 is not limited thereto in example embodiments of the present inventive concepts. For example, two or more semiconductor chips may be mounted to be stacked on the base chip 100 or may be mounted in parallel with each other. For the second substrate 201, the same description as that of the first substrate 101 of the base chip 100 may be applied.

The second device layer 210 may include a plurality of memory devices. For example, the second device layer 210 may include volatile memory devices such as DRAM and SRAM, or nonvolatile memory devices such as PRAM, MRAM, FeRAM, or RRAM. For example, in the semiconductor package 1000A of some example embodiments, the semiconductor chip 200 may include DRAM devices in the second device layer 210. Accordingly, the semiconductor package 1000A of some example embodiments may be used for high bandwidth memory (HBM) products, electro data processing (EDP) products, or the like.

The second device layer 210 may include a multilayer interconnection layer therebelow. The multilayer interconnection layer of the second device layer 210 may have the same characteristics as those described for the multilayer wiring layer 112 of the first device layer 110 in the base chip 100. Accordingly, the memory devices of the second device layer 210 may be electrically connected to the bump 220 through the multilayer interconnection layer.

In some example embodiments, the base chip 100 may include a plurality of logic devices and/or memory devices in the first device layer 110 and may be referred to as a buffer chip or a control chip, etc., depending on a function thereof, whereas the semiconductor chip 200 may include a plurality of memory devices in the second device layer 210 and may be referred to as a core chip. Alternatively, the base chip 100 may be referred to as a first semiconductor chip, and the semiconductor chip 200 may be referred to as a second semiconductor chip.

The bump 220 may be disposed on a connection pad 204 of a lower surface of the second device layer 210. The bump 220 may be connected to the memory devices through a wiring of the multilayer wiring layer of the second device layer 210. The bump 220 may electrically connect the semiconductor chip 200 and the base chip 100 to each other. The bump 220 may include, for example, solder, but may also include both a pillar and a solder according to some example embodiments. The pillar has a cylindrical or polygonal column shape such as a square or octagonal column and may include, for example, nickel (Ni), copper (Cu), palladium (Pd), platinum (Pt), gold (Au) or a combination thereof. The solder may have a spherical or ball shape and may include, for example, tin (Sn), indium (In), bismuth (Bi), antimony (Sb), copper (Cu), silver (Ag), zinc (Zn), lead (Pb) and/or alloys thereof. The alloys may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, etc. A height of the bump 220 may be determined according to wetting of the solder in a reflow process.

The underfill layer 300 may be disposed on a lower surface of the semiconductor chip 200. The underfill layer 300 may be disposed between the base chip 100 and the semiconductor chip 200 and surround side surfaces of the bump 220 and may fix the semiconductor chip 200 on the base chip 100. As shown in FIGS. 1A and 1B, the underfill layer 300 may extend to a side surface of the semiconductor chip 200 adjacent to the lower surface of the semiconductor chip 200, e.g., a lower end portion of the side surface of the semiconductor chip 200, while covering the bump 220 and the lower surface of the semiconductor chip 200. That is, the underfill layer 300 may include an inner underfill portion overlapping the semiconductor chip 200 in the Z-axis direction, a direction perpendicular to an upper surface of the base chip 100, and an outer underfill portion protruding outside the inner underfill portion. The outer underfill portion may protrude out of a region overlapping the semiconductor chip 200 to cover at least a portion of a side surface of the semiconductor chip. In an example, the outer underfill portion may be referred to as a fillet. The underfill layer 300 may be a non-conductive film (NCF), but is not limited thereto. The underfill layer 300 may include at least one of an epoxy resin, silica ($SiO_2$), and an acrylic copolymer, or a combination thereof.

The encapsulant 400 may be disposed on the base chip 100 and may cover a portion of the upper surface of the base chip 100, the upper and side surfaces of the semiconductor chip 200, and the side surface of the underfill layer 300. As shown in FIG. 1A, the encapsulant 400 may have a predetermined (or, alternatively, desired) thickness and cover the upper surface of the semiconductor chip 200. However, according to some example embodiments, the encapsulant 400 may not cover the upper surface of the semiconductor chip 200. In this case, the upper surface of the semiconductor chip 200 may be exposed from the encapsulant 400. The encapsulant 400 may include an insulating material, for example, an epoxy molding compound (EMC).

The base chip 100 may have a planar area larger than that of the semiconductor chip 200. Accordingly, the semiconductor chip 200 mounted on the base chip 100 may overlap the base chip 100 in plan view. The base chip 100 may have a first region and a second region, surrounding the first region. The semiconductor chip 200 may be disposed on the first region of the base chip 100. The outer underfill portion of the underfill layer 300 may contact the base chip 100 and may be disposed on the first region.

The organic material layer 450 may be disposed on the second region of the base chip 100. The organic material layer 450 may be in contact with the upper surface of the base chip 100. One side surface of the organic material layer 450 may be in contact with the outer underfill portion. The first region and the second region may be divided by a boundary in which the organic material layer 450 and the underfill layer 300 are in contact with each other. An upper surface of the organic material layer 450 may be in contact with the encapsulant 400. A lower surface of the organic material layer 450 may be in contact with an upper surface of the passivation layer 103 disposed on the second region. The organic material layer 450 may have a thickness greater than that of the passivation layer 103. For example, a thickness of the passivation layer 103 may range from about 200 nm to about 400 nm, and a thickness of the organic material layer 450 may range from about 200 nm to about 500 nm.

A length of the bump 220 in the Z-axis direction, that is, a height of the bump 220, may be greater than the thickness of the organic material layer 450. Accordingly, a level of the upper surface of the organic material layer 450 may be lower than a level of the lower surface of the semiconductor chip 200.

The organic material layer 450 may include a material different from that of the passivation layer 103. For example, the organic material layer 450 may include an organic material such as photosensitive polyimide (PSPI), and the passivation layer 103 may include an inorganic material such as silicon oxide, silicon nitride, or silicon oxynitride. The organic material layer 450 may include a material different from those of the underfill layer 300 and the encapsulant 400. For example, the organic material layer 450 may include photosensitive polyimide (PSPI), the encapsulant 400 may include an epoxy molding compound (EMC), and the underfill layer 300 may include at least one of an epoxy resin, silica ($SiO_2$), and an acrylic copolymer. Accordingly, the organic material layer 450 may be distinguished from the underfill layer 300 and the encapsulant 400.

The organic material layer 450 may be disposed on the inactive surface of the base chip 100, that is, the upper surface of the base chip 100, to electrically separate the base chip 100 from the upper components and protect the base chip 100 from an external impact.

In addition, the organic material layer 450 may improve adhesion between the base chip 100 and the encapsulant 400. For example, the base chip 100 may include silicon (Si) and the encapsulant 400 may include an organic material, and thus, a thermal expansion coefficient of the base chip 100 may be smaller than that of the encapsulant 400. Accordingly, on the level between the base chip 100 and the encapsulant 400, a smile force may act toward the encapsulant 400 at low temperatures, and a cry force may act toward the base chip 100 at high temperatures. These forces may cause warpage of the semiconductor package according to temperatures and delamination between the base chip 100 and the encapsulant 400. The organic material layer 450 may improve adhesion between the base chip 100 and the encapsulant 400 to suppress the warpage phenomenon and the delamination. As used herein, "smile force" may refer to a force that bends a specific object in an upward direction based on a certain level height of the specific object, and "cry force" may refer to a force that bends a specific object in a downward direction.

Figure 2:
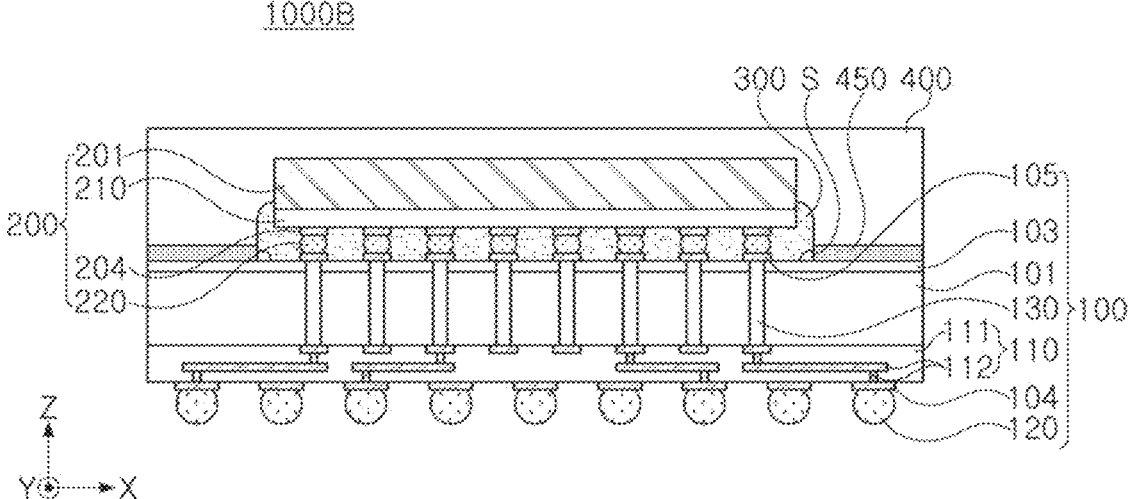
FIG. 2 is a cross-sectional view illustrating a semiconductor package according to some example embodiments of the present inventive concepts.

FIG. 2 is a cross-sectional view illustrating a semiconductor package 1000B according to some example embodiments of the present inventive concepts.

Referring to FIG. 2, in a semiconductor package 1000B according to some example embodiments, a structure of the underfill layer 300 may be different from that of the semiconductor package 1000A illustrated in FIG. 1A. Hereinafter, repeated descriptions the same as those described above with reference to FIGS. 1A and 1B are omitted.

The semiconductor package 1000B may further include a void S on the first region adjacent to the second region on the base chip 100. In this disclosure, the void S may refer to an empty space and may be referred to as an air gap. The void S may be an empty space generated while filling the semiconductor chip 200 and the underfill layer 300 on the first region adjacent to the organic material layer 450 disposed on the second region. The void S may be in contact with at least a portion of one side surface of the organic material layer 450. Accordingly, as compared with FIG. 1B, the underfill layer 300 may be disposed excluding the region in which the void S is disposed.

Figure 3:
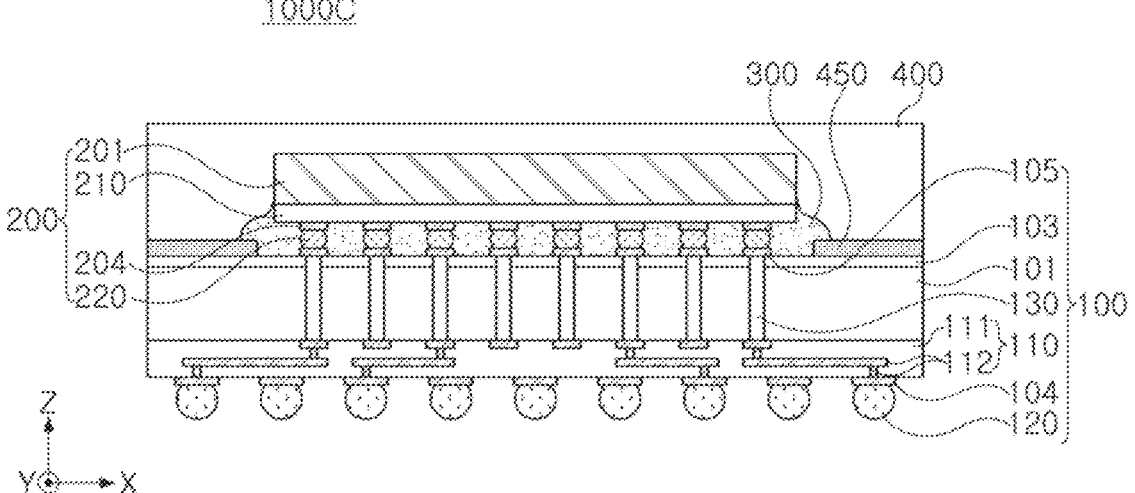
FIG. 3 is a cross-sectional view illustrating a semiconductor package according to some example embodiments of the present inventive concepts.

FIG. 3 is a cross-sectional view illustrating a semiconductor package 1000C according to some example embodiments of the present inventive concepts.

Referring to FIG. 3, in the semiconductor package 1000C according to some example embodiments, a structure of the underfill layer 300 may be different from that of the semiconductor package 1000A disposed in FIG. 1B.

In the semiconductor package 1000C, the outer underfill portion of the underfill layer 300 may extend to the second region. The outer underfill portion of the underfill layer 300 may extend onto the organic material layer 450 disposed on the second region. Accordingly, the underfill layer 300 may cover at least a portion of an upper surface of the organic material layer 450 adjacent to the side surface of the organic material layer 450. That is, unlike FIGS. 1A and 1B, in plan view, a portion of the organic material layer 450 and a portion of the underfill layer 300 may overlap each other in the Z-axis direction.

Figure 4:
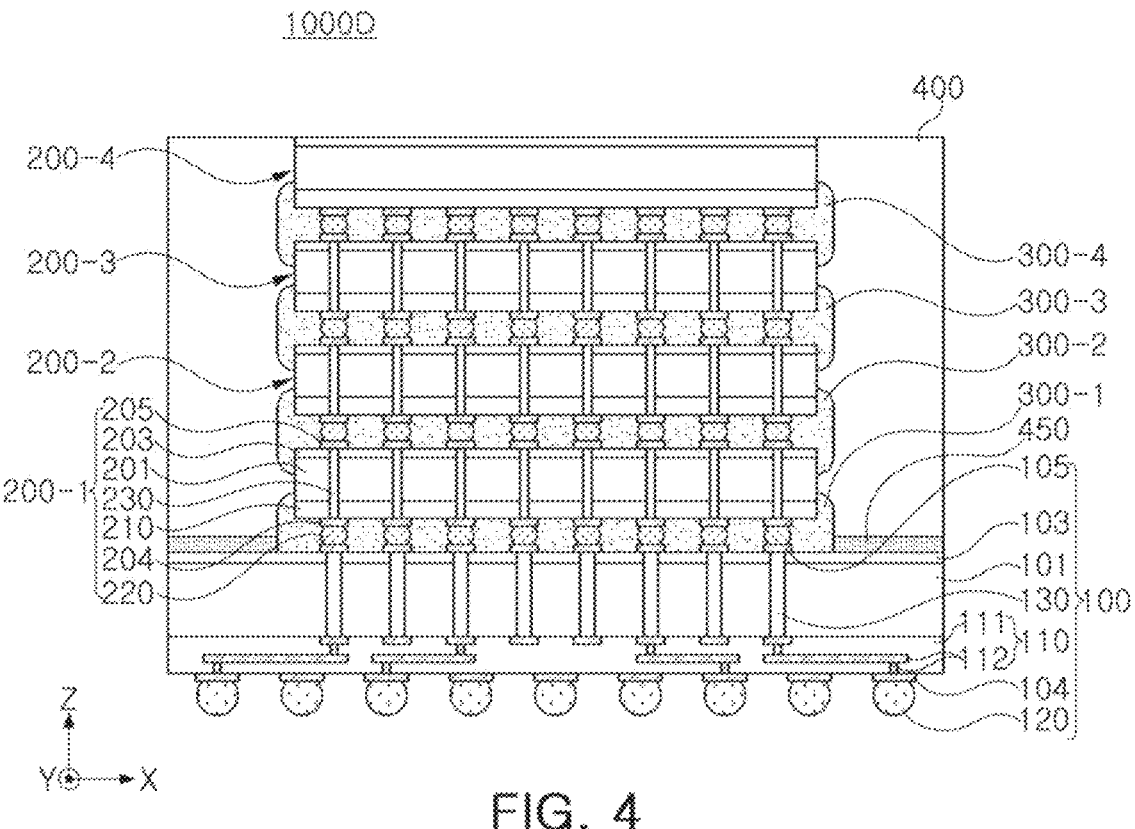
FIG. 4 is a cross-sectional view illustrating a semiconductor package according to some example embodiments of the present inventive concepts.

FIG. 4 is a cross-sectional view illustrating a semiconductor package 1000D according to some example embodiments of the present inventive concepts.

Referring to FIG. 4, in the semiconductor package 1000D according to some example embodiments, a structure in which a plurality of semiconductor chips 200-1, 200-2, 200-3, and 200-4 are stacked on the base chip 100 may be different from that of the semiconductor package 1000A illustrated in FIG. 1B.

In the semiconductor package 1000D, for example, first to fourth semiconductor chips 200-1, 200-2, 200-3, and 200-4 may be stacked on the base chip 100, and the first to fourth semiconductor chips 200-1, 200-2, 200-3, and 200-4 may be electrically connected through a TSV 230. In an example, the number of semiconductor chips 200 stacked on the base chip 100 may be two, three, or five or more.

Similar to the semiconductor chip 200 described above with reference to FIGS. 1A and 1B, each of the first to fourth semiconductor chips 200-1, 200-2, 200-3, and 200-4 may include the second device layer 210. Each of the first to third semiconductor chips 200-1, 200-2, and 200-3 may include a passivation layer 203 disposed on the second substrate 201, an upper pad 205, and the TSV 230 penetrating through the second substrate 201. However, the fourth semiconductor chip 200-4 may include the passivation layer 203 but may not include the upper pad 205 and the TSV 230. An upper surface of the fourth semiconductor chip 200-4 is not covered by the encapsulant 400, but in some example embodiments, the upper surface of the fourth semiconductor chip 200-4 may be covered by the encapsulant 400.

The first to fourth semiconductor chips 200-1, 200-2, 200-3, and 200-4 may be a volatile memory chip such as DRAM or SRAM or a non-volatile memory chip such as PRAM, MRAM, FeRAM, or RRAM.

The first semiconductor chip 200-1 may be stacked on the base chip 100 through the bump 220 and the underfill layer 300-1. The second to fourth semiconductor chips 200-2, 200-3, and 200-4 may be stacked through the bump 220 and underfill layers 300-2, 300-3, and 300-4 on the corresponding semiconductor chips, respectively. Specifically, the second semiconductor chip 200-2 may be stacked on the first semiconductor chip 200-1, the third semiconductor chip 200-3 may be stacked on the second semiconductor chip 200-2, and the fourth semiconductor chip 200-4 may be stacked on the third semiconductor chip 200-3 through the bump 220 and the underfill layers 300-2, 300-3, and 300-4. The outer underfill portions of the respective underfill layers 300-2, 300-3, and 300-4 corresponding to the second to fourth semiconductor chips 200-2, 200-3, and 200-4 may cover at least portions of the side surfaces of the adjacent semiconductor chips. The underfill layers 300-1, 300-2, 300-3, and 300-4 may include the same material.

An upper surface of the organic material layer 450 may be disposed on a level lower than a lower surface of the first semiconductor chip 200-1. The organic material layer 450 may be in contact with the outer underfill portion of the underfill layer 300-1 below the first semiconductor chip 200-1.

In some example embodiments, similarly to the example embodiments of FIGS. 2 and 3, the semiconductor package may have a void S (not shown) disposed in the underfill layer 300-1 corresponding to the first semiconductor chip 200-1, or the underfill layer 300-1 may cover at least a portion of the upper surface of the organic material layer 450.

Figure 5:
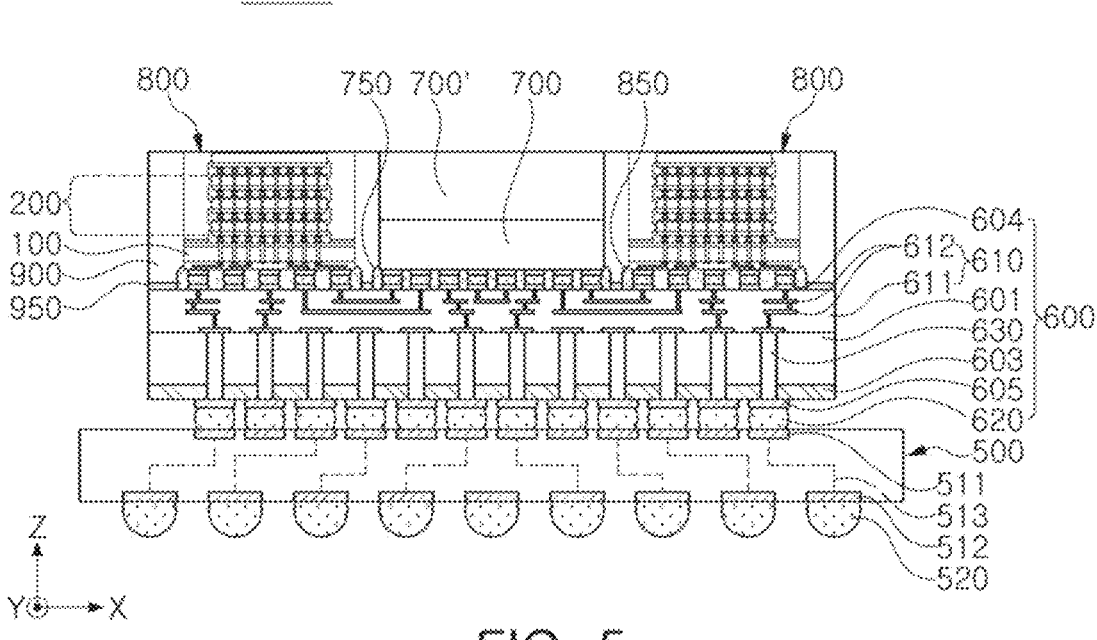
FIG. 5 is a cross-sectional view illustrating a semiconductor package according to some example embodiments of the present inventive concepts.

FIG. 5 is a cross-sectional view illustrating a semiconductor package 1000E according to some example embodiments of the present inventive concepts.

Referring to FIG. 5, the semiconductor package 1000E according to some example embodiments may include a package substrate 500, an interposer substrate 600, a first semiconductor structure 700 on the interposer substrate 600, at least one second semiconductor structure 800 disposed adjacent to the first semiconductor structure 700, and an interposer encapsulant 900 covering the first semiconductor structure 700 and the second semiconductor structure 800 on the interposer substrate 600. In addition, the semiconductor package 1000E may further include a first upper underfill layer 750 covering a portion between the first semiconductor structure 700 and the interposer substrate 600, a second upper underfill layer 850 covering a portion between the second semiconductor structure 800 and the interposer substrate 600, and an interposer organic material layer 950 disposed on the interposer substrate 600.

The package substrate 500 may include a lower pad 512 disposed on a lower surface of a body, an upper pad 511 disposed on an upper surface of the body, and a redistribution circuit 513 electrically connecting the lower pad 512 to the upper pad 511. The package substrate 500 may be a support substrate on which the interposer substrate 600, the first semiconductor structure 700, and the second semiconductor structure 800 are mounted, and may be a substrate for a semiconductor package including a printed circuit board (PCB), a ceramic substrate, a glass substrate, a tape wiring substrate, or the like. The body of the package substrate 500 may include different materials depending on the type of the substrate. For example, when the package substrate 500 is a PCB, it may have a form in which an interconnection layer is additionally stacked on one side or both sides of a body copper clad laminate or a copper clad laminate. Solder resist layers may be respectively formed on lower and upper surfaces of the package substrate 500. The lower and upper pads 512 and 511 and the redistribution circuit 513 may form an electrical path connecting the lower surface and the upper surface of the package substrate 500. The lower and upper pads 512 and 511 and the redistribution circuit 513 may include a metal material, for example, at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy including two or more thereof. The redistribution circuit 513 may include multiple redistribution layers and vias connecting the multiple redistribution layers. An external connection terminal 520 connected to the lower pad 512 may be disposed on a lower surface of the package substrate 500. The external connection terminal 520 may include tin (Sn), indium (In), bismuth (Bi), antimony (Sb), copper (Cu), silver (Ag), zinc (Zn), lead (Pb), and/or an alloy thereof.

The interposer substrate 600 may include a semiconductor substrate 601, a lower protective layer 603, a lower pad 605, a wiring layer 610, a bump 620, and a through electrode 630. The first semiconductor structure 700 and the second semiconductor structure 800 may be stacked on the package substrate 500 via the interposer substrate 600. The interposer substrate 600 may electrically connect the first semiconductor structure 700 and the second semiconductor structure 800 to each other.

The semiconductor substrate 601 may include, for example, silicon (Si). Accordingly, the interposer substrate 600 may be referred to as a silicon interposer.

A lower protective layer 603 may be disposed on a lower surface of the semiconductor substrate 601, and a lower pad 605 may be disposed on the lower protective layer 603. The lower pad 605 may be connected to the through electrode 630. The semiconductor structure 700 and the second semiconductor structure 800 may be electrically connected to the package substrate 500 through bumps 620 disposed on the lower pad 605.

The wiring layer 610 may be disposed on the upper surface of the semiconductor substrate 601 and may include an interlayer insulating layer 611 and a single-layer or multilayer wiring structure 612. When the wiring layer 610 has a multilayer wiring structure, wirings of different layers may be connected to each other through vertical contacts.

In some example embodiments, an upper protective layer may be disposed on an upper surface of the wiring layer 610. The upper protective layer may cover the wiring layer 610 but may not cover the vertical contact of the multilayer wiring structure 612 penetrating through a portion of the wiring layer 610. Accordingly, the upper surface of the vertical contact of the multilayer wiring structure 612 may be exposed. The upper pad 604 may cover the exposed portion of the multilayer wiring structure 612.

The through electrode 630 may extend from the upper surface to the lower surface of the substrate 601 to penetrate through the semiconductor substrate 601. Also, the through electrode 630 may extend into the wiring layer 610 and be electrically connected to the wirings of the wiring layer 610. Other structures and materials of the through electrode 630 are the same as those described for the semiconductor package 1000A of FIGS. 1A and 1B. According to some example embodiments, the interposer substrate 600 may include only a wiring layer therein and may not include a through electrode.

The interposer substrate 600 may be used for the purpose of converting or transferring an input electrical signal between the package substrate 500 and the first semiconductor structure 700 or the second semiconductor structure 800. Accordingly, the interposer substrate 600 may not include elements such as active elements or passive elements. Also, according to some example embodiments, the wiring layer 610 may be disposed below the through electrode 630. For example, a positional relationship of the wiring layer 610 and the through electrode 630 may be relative.

The bump 620 may be disposed on a lower surface of the interposer substrate 600 and may be electrically connected to the wiring of the wiring layer 610. The interposer substrate 600 may be stacked on the package substrate 500 through the bump 620. The bump 620 may be connected to the lower pad 605 through the wirings of the wiring layer 610 and the through electrode 630. In an example, some of the pads 605 used for power or ground may be integrated and connected to the bump 620, so that the number of the lower pads 605 may be greater than the number of the bumps 620.

The first semiconductor structure 700 may include, for example, a central processor (CPU), a graphics processor (GPU), a field programmable gate array (FPGA), a digital signal processor (DSP), a cryptographic processor, a microcontroller, a microprocessor, an analog-to-digital converter (ADC), an application-specific IC (ASIC), and the like. According to the types of devices included in the first semiconductor structure 700, the semiconductor package 1000E may be classified into a server-oriented semiconductor package or a mobile-oriented semiconductor package.

The second semiconductor structure 800 may have characteristics similar to those of the semiconductor packages 1000A, 1000B, 1000C, and 1000D described above with reference to FIGS. 1 to 4. For example, the second semiconductor structure 800 may include a base chip 100, a plurality of semiconductor chips 200 stacked on the base chip 100 in a vertical direction (Z-axis direction), and an underfill layer 300 (refer to FIG. 1A) disposed between the plurality of semiconductor chips 200. The underfill layer 300 may include an inner underfill portion overlapping a plurality of semiconductor chips 200 in the Z-axis direction, perpendicular to the upper surface of the interposer substrate 600, and an outer underfill portion protruding outward from the inner underfill portion. In addition, the second semiconductor structure 800 may include the organic material layer 450 (refer to FIG. 1A) in an adjacent region surrounding a region in which the plurality of semiconductor chips 200 are mounted on the base chip 100. However, according to some example embodiments, the second semiconductor structure 800 may not include the organic material layer 450.

The interposer encapsulant 900 may cover side and upper surfaces of the first semiconductor structure 700 and the second semiconductor structure 800. In addition, the semiconductor package 1000E may further include an external encapsulant covering the interposer substrate 600 and the interposer encapsulant 900 on the package substrate 500.

According to some example embodiments, the interposer encapsulant 900 and the outer encapsulant may be formed together and thus may not be distinguished from each other (e.g., they may be integral). Also, according to some example embodiments, the interposer encapsulant 900 may cover only the upper surface of the first semiconductor structure 700 but not the upper surface of the second semiconductor structure 800. In some example embodiments, an adhesive member 700' may be disposed on the first semiconductor structure 700. The adhesive member 700' may be an adhesive that solves a process problem caused by a height difference between the first semiconductor structure 700 and the second semiconductor structure 800. The adhesive member 700' may include, for example, a thermally conductive adhesive tape, thermally conductive grease, thermally conductive adhesive, or the like.

The first upper underfill layer 750 may be disposed between the interposer substrate 600 and the first semiconductor structure 700 and may be in contact with the interposer substrate 600 and the first semiconductor structure 700. The second upper underfill layer 850 may be disposed between the interposer substrate 600 and the second semiconductor structure 800 and may be in contact with the interposer substrate 600 and the second semiconductor structure 800.

The interposer substrate 600 may include a first region on which the first semiconductor structure 700 and the second semiconductor structure 800 are mounted, and a remaining second region. The first region may include a region in which the first upper underfill layer 750 and the second upper underfill layer 850 are in contact with the interposer substrate 600.

The interposer organic material layer 950 may be disposed on the second region of the interposer substrate 600. The interposer organic material layer 950 may be in contact with the upper surface of the interposer substrate 600. The interposer organic material layer 950 may be in contact with the interposer encapsulant 900.

A thickness of the interposer organic material layer 950 may range from about 200 nm to about 500 nm. The interposer organic material layer 950 may include photosensitive polyimide (PSPI). The interposer organic material layer 950 may include a material different from those of the first upper underfill layer 750, the second upper underfill layer 850, and the interposer encapsulant 900. Accordingly, the interposer organic material layer 950 may be distinguished from the first upper underfill layer 750, the second upper underfill layer 850, and the interposer encapsulant 900.

The interposer organic material layer 950 may improve adhesion between the interposer substrate 600 and the interposer encapsulant 900.

Figure 6:
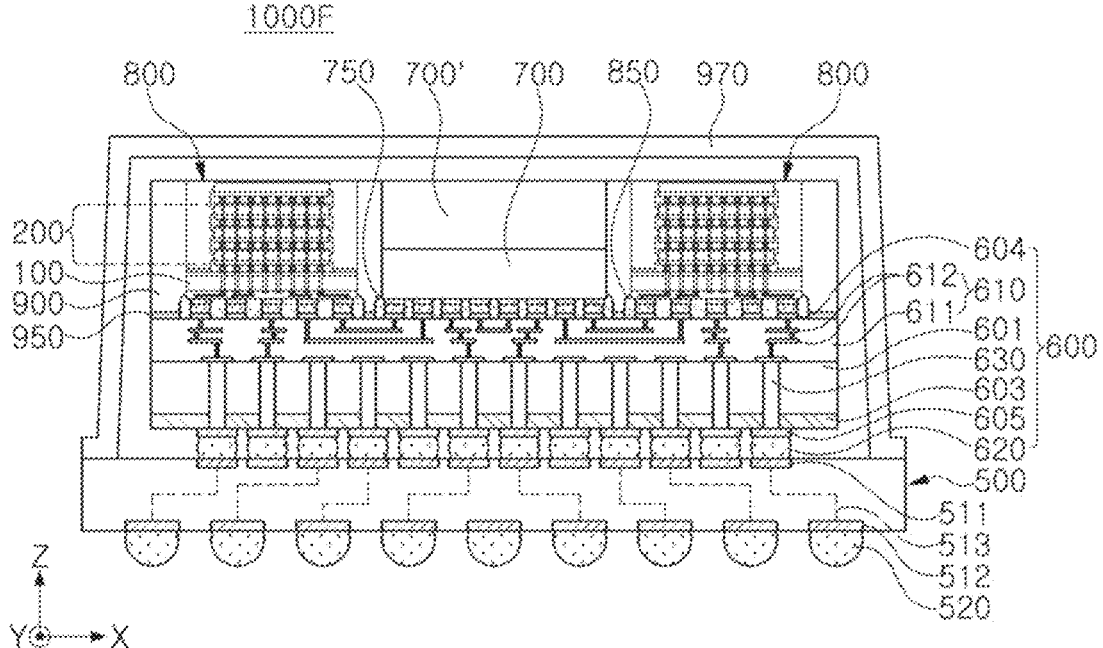
FIG. 6 is a cross-sectional view illustrating a semiconductor package according to some example embodiments of the present inventive concepts.

FIG. 6 is a cross-sectional view illustrating a semiconductor package 1000F according to some example embodiments of the present inventive concepts.

Referring to FIG. 6, the semiconductor package 1000F according to some example embodiments may have a structure in which a heat dissipation structure 970 disposed on the package substrate 500 and covering the first semiconductor structure 700 and the second semiconductor structure 800, which is different from the semiconductor package 1000E shown in FIG. 5.

The heat dissipation structure 970 may control warpage of the semiconductor package 1000F and dissipate heat generated in the first semiconductor structure 700 and the second semiconductor structure 800 externally. The heat dissipation structure 970 may completely cover the first semiconductor structure 700, the second semiconductor structure 800, and the interposer substrate 600, but is not limited thereto. For example, the heat dissipation structure 970 may have a plate shape covering only upper surfaces of the first semiconductor structure 700 and the second semiconductor structure 800. The heat dissipation structure 970 may include a material having excellent thermal conductivity, for example, aluminum (Al), gold (Au), silver (Ag), copper (Cu), iron (Fe), graphite, graphene, and the like.

FIGS. 7A to 7D are cross-sectional views illustrating a sequential process of manufacturing a semiconductor package according to some example embodiments of the present inventive concepts.

Figure 7A:
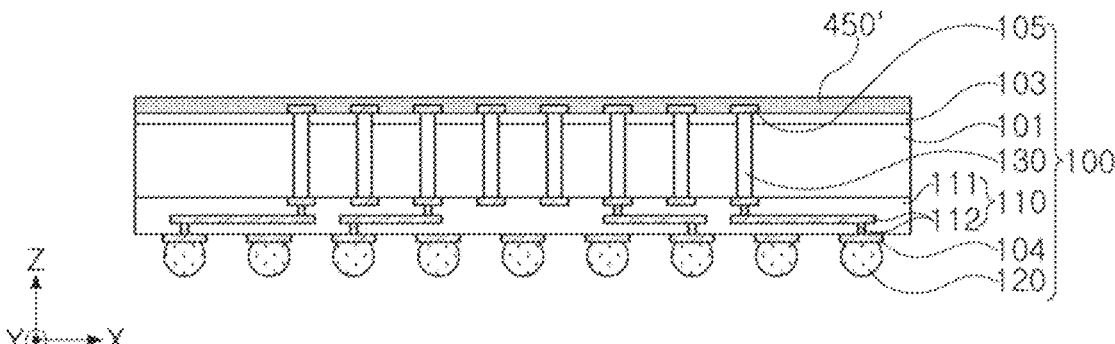
FIGS. 7A to 7D are cross-sectional views illustrating a sequential process of manufacturing a semiconductor package according to some example embodiments of the present inventive concepts.

Referring to FIG. 7A, first, a TSV 130 penetrating through a portion of a lower end of the substrate may be formed, and the device layer 110, the lower pad 104, and the external connection terminal 120 may be formed on a lower surface of the substrate. Next, the first substrate 101 may be formed by performing chemical mechanical polishing (CMP) process on a portion of an upper end of the substrate, and the TSV 130 may be exposed. A passivation layer 103 covering the exposed side surface of the TSV 130 may be formed to be coplanar with the TSV 130, and an upper pad 105 in contact with the TSV 130 may be formed to form the base chip 100. An organic material layer 450' covering the upper surface of the base chip 100 may be formed on the base chip 100. The organic material layer 450' may be formed through a spin coating process.

Figure 7B:
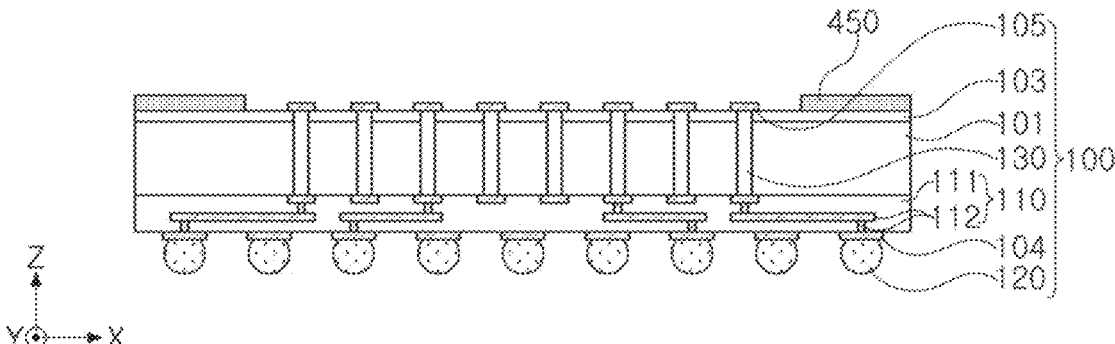

Referring to FIG. 7B, a patterned organic material layer 450 may be formed by removing a portion of the organic material layer 450' through photolithography and etching processes. When the organic material layer 450' includes photosensitive polyimide (PSPI), precise patterning may be performed during the photolithography and etching process. Referring to the description of FIGS. 1A to 1B, the second region may refer to a region in which the organic material layer 450 formed through the etching process is disposed in the base chip 100.

Figure 7C:
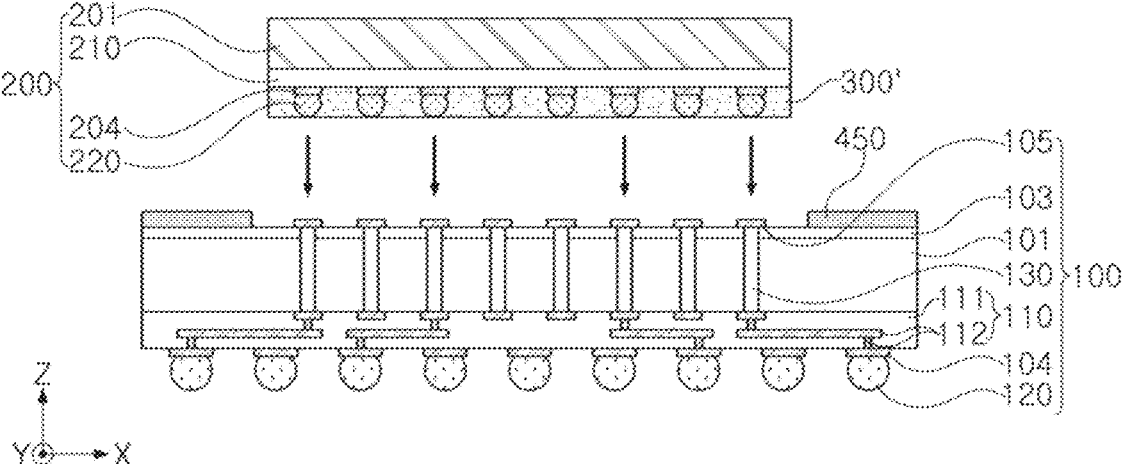

Referring to FIG. 7C, an adhesive film 300' covering at least a portion of the bump 220 may be formed on the lower surface of the semiconductor chip 200 including the second substrate 201, the second device layer 210, and the bump 220. The semiconductor chip 200 to which the adhesive film 300' is attached may be mounted on the base chip 100 through a thermal compression (TC) process or the like. However, a method of mounting the semiconductor chip 200 on the base chip 100 is not limited thereto.

Figure 7D:
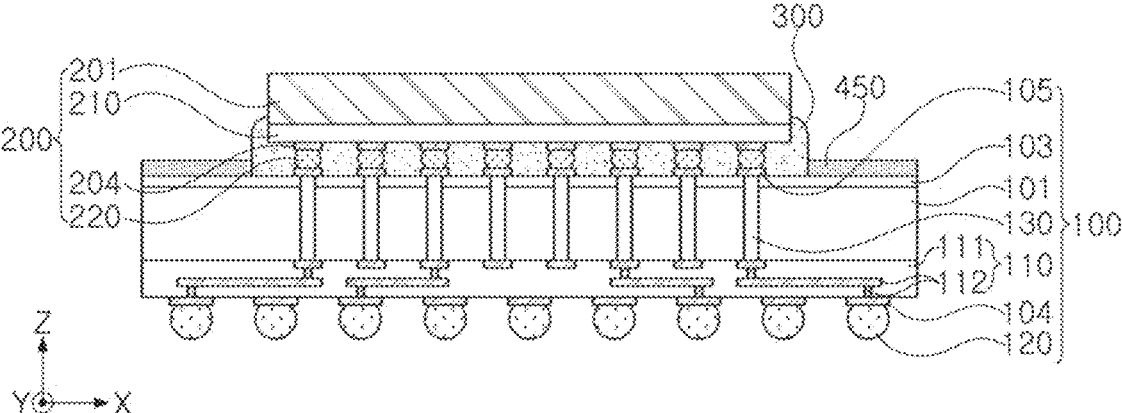

Referring to FIG. 7D, the bump 220 of the semiconductor chip 200 and the upper pad 105 of the base chip 100 may be in contact with each other and electrically connected by the thermal compression (TC) process performed at high temperature and high pressure. At the high temperature, the adhesive film 300' may protrude to an outer portion of a region in which the base chip 100 and the semiconductor chip 200 overlap each other, to cover at least a portion of the side surface of the semiconductor chip 200, as well as the region in which the base chip 100 and the semiconductor chip 200 overlap each other. Next, the adhesive film 300' may be cured to form the underfill layer 300. Accordingly, the underfill layer 300 may have an inner underfill portion in which the base chip 100 and the semiconductor chip 200 overlap each other in plan view and an outer underfill portion protruding outwardly from the inner underfill portion.

As set forth above, according to some example embodiments of the present inventive concepts, in packaging a plurality of semiconductor chips having different sizes, an organic material layer is disposed locally to improve adhesion between the semiconductor chip and the encapsulant, thereby providing a semiconductor package having improved reliability and production yield.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While example embodiments have been shown and described above, it will be apparent to those skilled in the art that modifications and variations could be made without departing from the scope of the present inventive concepts as defined by the appended claims.

What is claimed is:

1. A semiconductor package comprising:
a base chip including a passivation layer on an upper surface thereof;
a semiconductor chip on the base chip;
a bump on a lower surface of the semiconductor chip;
an underfill layer covering the bump and covering the lower surface of the semiconductor chip;
an encapsulant covering the semiconductor chip on the base chip; and
an organic material layer on the passivation layer, an uppermost surface in a vertical direction of the organic material layer contacting the encapsulant, the vertical direction perpendicular the upper surface of the base chip,
wherein the base chip includes silicon (Si), the passivation layer has a first region in contact with the underfill layer and a second region, surrounding the first region, and the organic material layer is on the second region.

2. The semiconductor package of claim 1, wherein the organic material layer includes a material different from that of the passivation layer.

3. The semiconductor package of claim 2, wherein the organic material layer includes a photosensitive polyimide (PSPI), and the passivation layer includes at least one of silicon oxide, silicon nitride, or silicon oxynitride.

4. The semiconductor package of claim 1, wherein the organic material layer includes a material different from those of the underfill layer and the encapsulant.

5. The semiconductor package of claim 4, wherein the organic material layer includes a photosensitive polyimide (PSPI) and the encapsulant includes an epoxy molding compound (EMC).

6. The semiconductor package of claim 1, wherein the uppermost surface of the organic material layer is to be lower than a height of the lower surface of the semiconductor chip.

7. The semiconductor package of claim 1, wherein a thickness of the organic material layer ranges from about 200 nm to about 400 nm.

8. The semiconductor package of claim 1, wherein the organic material layer is in contact with the base chip and the encapsulant.

9. The semiconductor package of claim 1, wherein
the underfill layer covers at least a portion of a side surface of the semiconductor chip,
a side surface of the organic material layer is in contact with the underfill layer, and
a lower surface of the organic material layer is in contact with the base chip.

10. The semiconductor package of claim 1, wherein a void is on one side of the underfill layer on the first region adjacent to the second region.

11. The semiconductor package of claim 10, wherein the void is in contact with a portion of a side surface of the organic material layer on the second region.

12. The semiconductor package of claim 1, wherein the underfill layer covers at least a portion of the uppermost surface of the organic material layer adjacent to a side surface of the organic material layer.

13. The semiconductor package of claim 1, wherein a bottom of the base chip includes a device layer.

14. A semiconductor package comprising:
a first semiconductor chip having a first region and a second region, surrounding the first region, the first semiconductor chip including a passivation layer on an upper surface thereof;
a semiconductor structure including a second semiconductor chip on the first region of the first semiconductor chip;
a bump on a lower surface of the semiconductor structure;
an underfill layer covering a region in which the first semiconductor chip and the semiconductor structure overlap each other in the first region and covering at least a portion of a lower end of a side surface of the semiconductor structure;
a first organic material layer surrounding a side surface of the underfill layer on the second region; and
an encapsulant covering the semiconductor structure on the first semiconductor chip, an uppermost surface in a vertical direction of the first organic material layer contacting the encapsulant, the vertical direction parallel to a side surface of the first semiconductor chip,
wherein the first semiconductor chip has an area larger than that of the second semiconductor chip in plan view, and
wherein the first semiconductor chip includes silicon (Si), the passivation layer contacts the underfill layer on the first region, and the first organic material layer is on the second region.

15. The semiconductor package of claim 14, wherein
the first organic material layer includes a photosensitive polyimide (PSPI), and
the first organic material layer includes a material different from a material of the first semiconductor chip and a material of the encapsulant.

16. The semiconductor package of claim 14, wherein
the semiconductor structure further includes at least one third semiconductor chip on the second semiconductor chip, and
the second semiconductor chip and the at least one third semiconductor chip are dynamic random access memory (DRAM) chips.

17. The semiconductor package of claim 14, wherein
the semiconductor structure further includes at least one third semiconductor chip on the second semiconductor chip, and
the second semiconductor chip has an area larger than that of the at least one third semiconductor chip in plan view, and wherein the semiconductor package further includes a second organic material layer surrounding at least a portion including a lower end of a side surface of the at least one third semiconductor chip on the second semiconductor chip.

18. A semiconductor package comprising:

a package substrate;

an interposer substrate on the package substrate and including a silicon (Si) layer;

a first semiconductor structure on the interposer substrate;

a second semiconductor structure adjacent to the first semiconductor structure on the interposer substrate, the second semiconductor structure including a base chip including a passivation layer on an upper surface thereof, a semiconductor chip on the base chip, a first semiconductor structure bump on a lower surface of the semiconductor chip, a first semiconductor structure underfill layer covering the first semiconductor structure bump and covering the lower surface of the semiconductor chip, an encapsulant covering the semiconductor chip on the base chip, and a first semiconductor structure organic material layer on the passivation layer, an uppermost surface in a vertical direction of the first semiconductor structure organic material layer contacting the encapsulant, the vertical direction perpendicular the upper surface of the base chip, wherein the base chip includes silicon (Si), the passivation layer has a first region in contact with the first semiconductor structure underfill layer and a second region, surrounding the first region, and the first semiconductor structure organic material layer is on the second region; and an interposer encapsulant covering the first semiconductor structure and the second semiconductor structure on the interposer substrate, wherein an upper surface of the interposer substrate has a first region in which the first semiconductor structure and the second semiconductor structure are mounted and a remaining second region, and the interposer substrate further includes an interposer organic material layer on the remaining second region and including a photosensitive polyimide (PSPI), an uppermost surface in a vertical direction of the interposer organic material layer contacting the interposer encapsulant, the vertical direction perpendicular the upper surface of the interposer substrate.

19. The semiconductor package of claim 18, further comprising:

a bump on a lower surface of each of the first and second semiconductor structures and electrically connected to the interposer substrate; and an underfill layer covering the bump.

20. The semiconductor package of claim 19, wherein the underfill layer includes a first underfill layer on the lower surface of the first semiconductor structure and a second underfill layer on the lower surface of the second semiconductor structure, the first underfill layer covers at least a portion including the lower surface of the first semiconductor structure and a lower end of a side surface of the first semiconductor structure, the second underfill layer covers at least a portion including the lower surface of the second semiconductor structure and a lower end of a side surface of the second semiconductor structure, and the interposer organic material layer is spaced apart from the first and second semiconductor structures and in contact with the first and second underfill layers.

* * * * *